(12) United States Patent
Hu

(10) Patent No.: US 12,035,609 B2
(45) Date of Patent: Jul. 9, 2024

(54) DISPLAY PANEL INCLUDING ROUGHENED SURFACE FLEXIBLE SUBSTRATE

(71) Applicant: WUHAN CHINA STAR OPTOELECTRONICS SEMICONDUCTOR DISPLAY TECHNOLOGY CO., LTD., Hubei (CN)

(72) Inventor: Kai Hu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 717 days.

(21) Appl. No.: 16/640,634

(22) PCT Filed: Jan. 8, 2020

(86) PCT No.: PCT/CN2020/070894
§ 371 (c)(1),
(2) Date: Feb. 20, 2020

(87) PCT Pub. No.: WO2021/022784
PCT Pub. Date: Feb. 11, 2021

(65) Prior Publication Data
US 2021/0408406 A1    Dec. 30, 2021

(30) Foreign Application Priority Data
Aug. 8, 2019 (CN) .......................... 201910730167.6

(51) Int. Cl.
*H10K 59/12* (2023.01)
*G06F 1/16* (2006.01)
(Continued)

(52) U.S. Cl.
CPC ........... *H10K 77/111* (2023.02); *H10K 59/12* (2023.02); *H10K 71/00* (2023.02);
(Continued)

(58) Field of Classification Search
CPC ......... H01L 51/0097; H01L 2251/5338; H01L 27/3244; H01L 33/22; H01L 33/24;
(Continued)

(56) References Cited

U.S. PATENT DOCUMENTS 6,106,657 A * 8/2000 Rossignol ............. B29C 66/452
369/287
9,496,510 B2 * 11/2016 Kim ..................... H01L 51/0097
(Continued)

FOREIGN PATENT DOCUMENTS

CN    104538425 A  *  4/2015
CN    105977398 A  *  9/2016
(Continued)

*Primary Examiner* — Ida M Soward

(57) ABSTRACT

A display panel and a method of manufacturing the same are disclosed. The display panel includes a bending area. The display panel includes a first flexible substrate. A buffer layer is disposed on a surface of the first flexible substrate. A rough structure is disposed on a surface of the first flexible substrate in contact with the buffer layer in the bending area.

4 Claims, 5 Drawing Sheets

(51) Int. Cl.
*H10K 71/00* (2023.01)
*H10K 77/10* (2023.01)
*G02F 1/1333* (2006.01)
*G09F 9/30* (2006.01)
*H01L 33/12* (2010.01)
*H01L 33/22* (2010.01)
*H01L 33/24* (2010.01)
*H10K 102/00* (2023.01)

(52) U.S. Cl.
CPC ...... *G02F 1/133305* (2013.01); *G06F 1/1641* (2013.01); *G06F 1/1652* (2013.01); *G09F 9/301* (2013.01); *H01L 33/12* (2013.01); *H01L 33/22* (2013.01); *H01L 33/24* (2013.01); *H10K 59/1201* (2023.02); *H10K 2102/311* (2023.02)

(58) Field of Classification Search
CPC ... H01L 33/12; G02F 1/133305; G09F 9/301; G06F 1/1652; G06F 1/1641; G06F 9/301
See application file for complete search history.

(56) References Cited

U.S. PATENT DOCUMENTS

| | | | | |
|---|---|---|---|---|
| 2007/0059942 | A1* | 3/2007 | Hu | C23C 16/45523 438/785 |
| 2008/0157235 | A1* | 7/2008 | Rogers | H05K 1/0283 257/415 |
| 2009/0020910 | A1* | 1/2009 | Forrest | H01L 51/0004 264/259 |
| 2010/0015535 | A1* | 1/2010 | Song | G03F 1/68 430/323 |
| 2010/0193469 | A1* | 8/2010 | Lee | B44C 1/22 216/49 |
| 2011/0062479 | A1* | 3/2011 | Sugano | H01L 24/32 257/98 |
| 2011/0095327 | A1* | 4/2011 | Shinohara | H01L 33/16 257/E33.028 |
| 2011/0139225 | A1* | 6/2011 | Boydell | H01L 31/0547 156/196 |
| 2014/0225062 | A1* | 8/2014 | Weng | H01L 33/32 438/47 |
| 2015/0049428 | A1* | 2/2015 | Lee | G06F 1/1652 361/679.27 |
| 2015/0263235 | A1* | 9/2015 | Shin | H01L 33/38 257/72 |
| 2016/0155788 | A1* | 6/2016 | Kwon | H01L 27/3258 257/40 |
| 2017/0012378 | A1* | 1/2017 | Hassan-Ali | H05K 3/361 |
| 2017/0262022 | A1* | 9/2017 | Choi | G06F 1/1652 |
| 2017/0271312 | A1* | 9/2017 | Kwon | H01L 25/0753 |
| 2018/0019418 | A1* | 1/2018 | Sonoda | H01L 51/5253 |
| 2018/0090698 | A1* | 3/2018 | Jeong | H01L 51/003 |
| 2018/0104915 | A1* | 4/2018 | Liu | B32B 3/263 |
| 2018/0143353 | A1* | 5/2018 | Kim | H05K 5/0017 |
| 2018/0150108 | A1* | 5/2018 | Song | G06F 1/1677 |
| 2018/0175310 | A1* | 6/2018 | Lee | H10K 50/844 |
| 2018/0190936 | A1* | 7/2018 | Lee | B32B 25/20 |
| 2019/0013497 | A1* | 1/2019 | So | G02B 27/425 |
| 2019/0067410 | A1* | 2/2019 | Kwon | H01L 27/3276 |
| 2019/0157069 | A1* | 5/2019 | Song | H01L 33/32 |
| 2019/0179470 | A1* | 6/2019 | Hong | G09G 3/3275 |
| 2019/0207141 | A1* | 7/2019 | Kim | H10K 77/111 |
| 2019/0267557 | A1* | 8/2019 | Zhao | H01L 51/5253 |
| 2019/0305232 | A1* | 10/2019 | Chen | H10K 77/111 |
| 2020/0044198 | A1* | 2/2020 | Bai | H01L 27/3244 |
| 2020/0127216 | A1* | 4/2020 | Tao | H01L 51/5253 |
| 2021/0050399 | A1* | 2/2021 | Cho | H10K 59/1216 |
| 2021/0336234 | A1* | 10/2021 | Zheng | H01L 27/3258 |

FOREIGN PATENT DOCUMENTS

| | | | |
|---|---|---|---|
| CN | 207366891 U | 5/2018 | |
| CN | 108346376 A | 7/2018 | |
| CN | 106816530 B | 2/2019 | |
| CN | 109407872 A | 3/2019 | |
| CN | 109461824 A | 3/2019 | |
| EP | 1868256 A2 * | 12/2007 | ............ H05B 33/04 |

* cited by examiner

DISPLAY PANEL INCLUDING ROUGHENED SURFACE FLEXIBLE SUBSTRATE

This application claims the priority of China Patent Application serial No. 201910730167.6, filed Aug. 8, 2019, titled "DISPLAY PANEL AND MANUFACTURING METHOD THEREOF", the disclosures of which are incorporated herein by reference in their entirety.

BACKGROUND OF INVENTION

1. Field of Invention

The present invention relates to a technical field of displays, and particularly to, a display panel and a manufacturing method thereof.

2. Related Art

Currently, most manufacturers use active-matrix organic light-emitting diode (AMOLED) technology based on flexible polyimide to achieve foldable and narrow bezel design displays. Polyimide has a characteristic of good flexibility, so it can be used for foldable products. By bending downward integrated circuit (IC) assembly areas of chip one Pi (COP) bonding areas of chip on film (COF) lower frames and part of wirings and circuits, lower frames of original rigid display panels can become smaller.

However, in current display panels, because polyimide has a small molecular polarity, bonding force between the polyimide and the buffer layers of silicon dioxide is weak, and a phenomenon that polyimide peels off easily when display panels are bent, seriously affecting display effects of the display panels. A current method to improve peeling is to clean surfaces of polyimide substrates and to reduce particles, but this method cannot thoroughly solve the problem.

Therefore, it is imperative to provide an improved display panel to overcome the above-mentioned problem.

SUMMARY OF INVENTION

In current display panels, because polyimide has a small molecular polarity, bonding force between the polyimide and the buffer layers of silicon dioxide is weak, and a phenomenon that polyimide peels off easily when display panels are bent, seriously affecting display effects of the display panels. A current method to improve peeling is to clean surfaces of polyimide substrates and to reduce particles, but this method cannot thoroughly solve the problem.

The present invention is to provide a display panel capable of increasing a surface bonding force between a flexible substrate and a buffer layer to overcome a technical problem of a poor bonding force between material of flexible substrates and material of buffer layers of conventional display panels due to intrinsic material property of the flexible substrates, thereby adversely affecting displaying.

In order to overcome the above-mentioned problem, the present invention provides a technical solution as follows:

The present invention provides a display panel, provided with a bending area, the display panel comprising a first flexible substrate; and a buffer layer disposed on a surface of the first flexible substrate; wherein a rough structure is disposed on a surface of the first flexible substrate in contact with the buffer layer in the bending area.

In one embodiment of the present invention, the display panel further comprises a non-bending area, and a surface of the first flexible substrate in contact with the buffer layer in the non-bending area is provided with the rough structure.

In one embodiment of the present invention, the display panel further comprises a second flexible substrate disposed on a surface of the buffer layer away from a side of the first flexible substrate, wherein a surface of the second flexible substrate in contact with the buffer layer is provided with the rough structure.

In one embodiment of the present invention, a chemical bond is formed between material molecules of the rough structure and material molecules of the buffer layer.

In one embodiment of the present invention, the buffer layer is made of silicon dioxide, the rough structure is made of a material comprising a carboxylic acid group, and a chemical bond is formed between the carboxylic acid group and the silicon dioxide.

In one embodiment of the present invention, the rough structure has a predetermined pattern.

In one embodiment of the present invention, the rough structure has a plurality of grooves.

The present invention further provides a method of manufacturing a display panel comprising providing a first flexible substrate, comprising a bending area; forming a rough structure on a surface of the first flexible substrate in the bending area; and depositing a buffer layer on the surface of the first flexible substrate configured with the rough structure.

In one embodiment of the present invention, the method further comprises providing a second flexible substrate, and the second flexible substrate comprising a bending area; providing the rough structure on a surface of the second flexible substrate in the bending area of the second flexible substrate; and disposing the second flexible substrate on a surface of the buffer layer away from the first flexible substrate; wherein the surface of the second flexible substrate provided with the rough structure is in contact with the buffer layer.

In one embodiment of the present invention, a chemical bond is formed between material molecules of the rough structure and material molecules of the buffer layer.

In one embodiment of the present invention, the buffer layer is made of silicon dioxide, the rough structure is made of a material comprising a carboxylic acid group, and a chemical bond is formed between the carboxylic acid group and the silicon dioxide.

In one embodiment of the present invention, the rough structure has a predetermined pattern.

In one embodiment of the present invention, the rough structure has a plurality of grooves.

In one embodiment of the present invention, the first flexible substrate further comprises a non-bending area, and a surface of the first flexible substrate in contact with the buffer is provided the rough structure in the non-bending area.

The present invention provides a display panel and a method of manufacturing the same. The display panel includes a bending area, a first flexible substrate, and a buffer layer disposed on a surface of the first flexible substrate, wherein a rough structure is disposed on a surface of the first flexible substrate in contact with the buffer layer in the bending area. The rough structure has a certain roughness capable of increasing a surface bonding force between the buffer layer and the first flexible substrate. Furthermore, the rough structure contains a carboxylic acid group, and a chemical bond is formed between the carboxylic acid group and the buffer layer, so that the surface bonding force between a flexible substrate and the buffer layer is further increased, thereby overcoming a problem that the flexible substrate is likely to peel in the bending area when bending. The display panel of the present invention may also be provided with the rough structure on a surface of the flexible substrate in contact with the buffer layer in a non-bending area to avoid a risk of peeling of the flexible substrate in the non-bending area. The method of manufacturing the display panel of the invention is simple, and a manufacturing process is easily controlled, thereby achieving a display panel having excellent display quality and high product yield.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The present invention is aimed at overcoming a technical problem of a poor bonding force between material of flexible substrates and material of buffer layers of conventional display panels due to intrinsic material property of the flexible substrates, thereby adversely affecting displaying.

Figure 1:
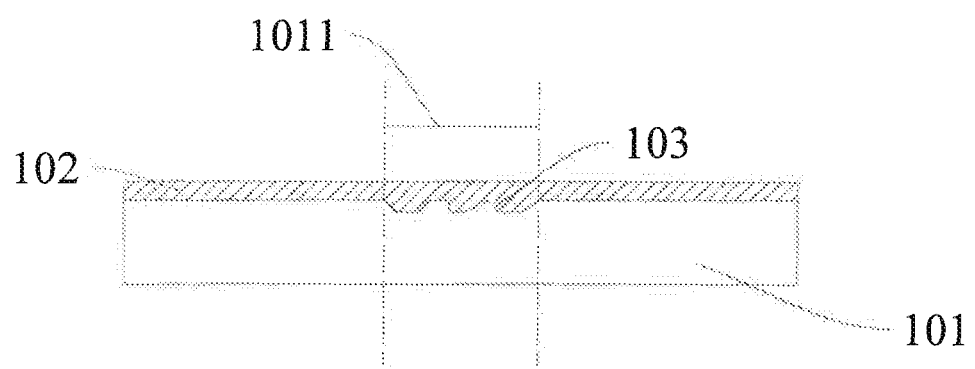
FIG. 1 is a schematic structural view of a display panel in accordance with a first embodiment of the present invention.

Please refer to FIG. 1. In a first embodiment, the present invention provides a display panel, including a bending area 1011. The display panel includes a first flexible substrate 101, a buffer layer 102 disposed on a surface of the first flexible substrate 101. A rough structure 103 is disposed on a surface of the first flexible substrate 101 in contact with the buffer layer 102 in the bending area 1011.

Specifically, the first flexible substrate 101 is made of polyimide. The buffer layer 102 is made of silicon dioxide. The surface of the first flexible substrate 101 in contact with the buffer layer 102 is treated, so that the rough structure 103 is formed on the surface of the first flexible substrate 101 in contact with the buffer layer 102. In a process of forming the rough structure 103, an imide bond in the polyimide is hydrolyzed to form a carboxylic acid group, and the carboxylic acid group is combined with the silicon dioxide in the buffer layer 102 to form a chemical bond, thereby to increase a surface bonding force between the first flexible substrate and the buffer layer 102.

The rough structure 103 may be a structure having a predetermined pattern. Specifically, when the surface of the first flexible substrate 101 in contact with the buffer layer 102 is treated, a photoresist material is used to protect a non-bending area of the first flexible substrate 101, wherein the surface of the first flexible substrate 101 in contact with the buffer layer 102 is treated in a specific direction, so that the rough structure 103 configured with the predetermined pattern is obtained finally.

Alternatively, the rough structure 103 may include a plurality of groves. Specifically, when the surface of the first flexible substrate 101 in contact with the buffer layer 102 is treated, a photoresist material is used to protect a non-bending area of the first flexible substrate 101, and finally the rough structure 103 is configured with the plurality of the grooves.

Figure 5:
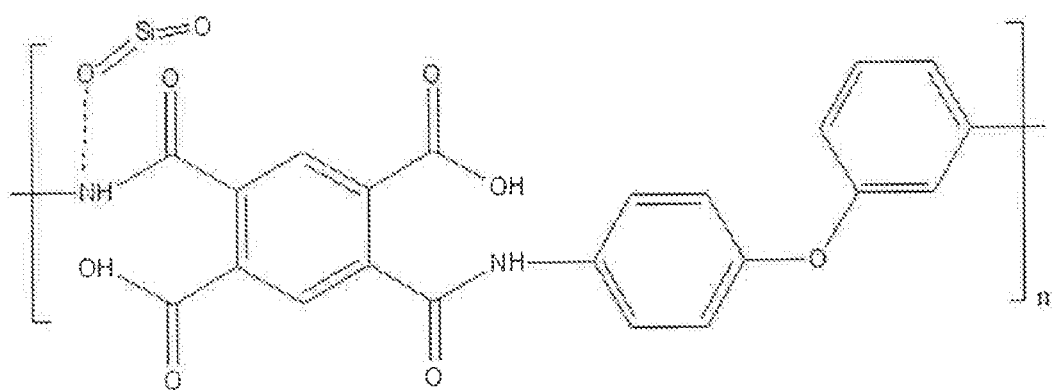
FIG. 5 is a schematic structural view showing a molecule acting between a material of a rough structure and a material of a buffer layer of the present invention.

In the first embodiment of the present invention, the rough structure is formed on part of the surface of the first flexible substrate in the bending area. By using roughness of the first flexible substrate, a surface bonding force between the first flexible substrate and the buffer layer can be increased, and a carboxylic acid group, referring to FIG. 5, is contained in the rough structure, wherein a chemical bond is formed between the carboxylic acid group and the silicon dioxide of the buffer layer to further increase the surface bonding force between the first flexible substrate and the buffer layer, thereby improving a situation of peeling of the first flexible substrate and the buffer layer when bending in the bending area.

Figure 2:
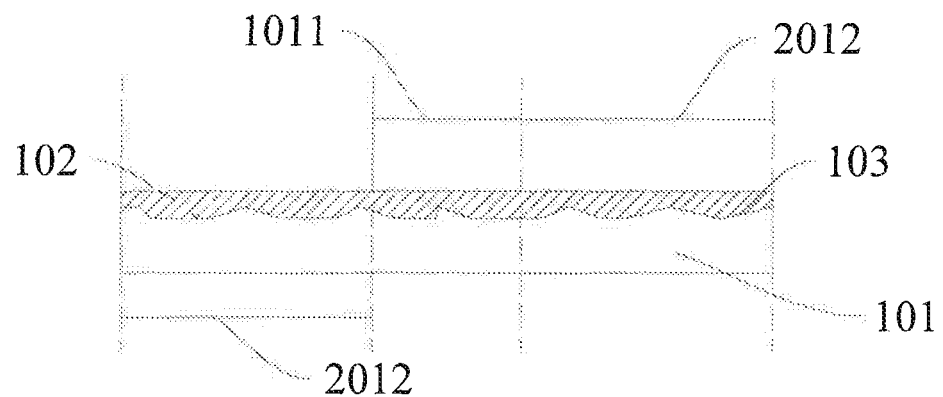
FIG. 2 is a schematic structural view of a display panel in accordance with a second embodiment of the present invention.

Please refer to FIG. 2. A display panel in accordance with a second embodiment of the present invention is different from the first embodiment in that the display panel further includes a non-bending area 2012, and a surface of the first flexible substrate 101 in contact with the buffer layer 102 is also provided with the rough structure 103 in the non-bending area 2012.

In this manner, an entire surface treatment may be performed on the surface of the first flexible substrate 101 in contact with the buffer layer 102, and the rough structure 103 may be a structure configured with a predetermined pattern. Specifically, when treating the surface of the first flexible substrate 101 in contact with the buffer layer 102, the surface of the first flexible substrate 101 in contact with the buffer layer 102 is treated in a specific direction, so that the rough structure 103 configured with the predetermined pattern is finally obtained. Alternatively, the rough structure 103 may include a plurality of groves. Specifically, when the surface of the first flexible substrate 101 in contact with the buffer layer 102 is treated for a certain period, the rough structure 103 having the grooves can be obtained.

In the display panel, the first flexible substrate 101 is made of polyimide. When the first flexible substrate 101 is treated, the polyimide undergoes hydrolysis to generate a carboxylic acid group, and the carboxylic acid group is combined with the silicon dioxide in the buffer layer 102 to form a chemical bond, thereby increasing a bonding force between the first flexible substrate 101 and the buffer layer 102.

In the second embodiment, the rough structure is formed on the entire surface of the first flexible substrate of the display panel. By using roughness of the first flexible substrate, a surface bonding force between the first flexible substrate and the buffer layer can be increased, and a carboxylic acid group, referring to FIG. 5, is contained in the rough structure, wherein a chemical bond is formed between the carboxylic acid group and the silicon dioxide of the buffer layer to further increase the surface bonding force between the first flexible substrate and the buffer layer, thereby not only improving a situation of peeling of the first flexible substrate and the buffer layer in the bending area, but also avoiding a risk of peeling of the first flexible substrate in the non-bending area.

Figure 3:
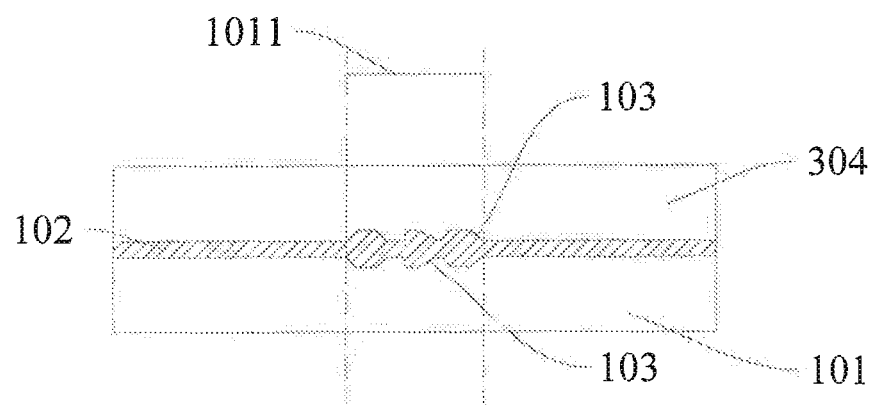
FIG. 3 is a schematic structural view of a display panel in accordance with a third embodiment of the present invention.

Please refer to FIG. 3. A display panel in accordance with a third embodiment of the present invention is different from the first embodiment in that the display panel further includes a second flexible substrate 304. The second flexible substrate 304 is disposed on a surface of the buffer layer 102 away from the first flexible substrate 101. In the bending area 1011, a surface of the second flexible substrate 304 in contact with the buffer layer 102 is provided with the rough structure 103.

The display panel of this embodiment uses a two-layered flexible substrate structure. The second flexible substrate 304 is also treated to form the rough structure 103 to increase a surface bonding force between the second flexible substrate 304 and the buffer layer 102.

The rough structure 103 may be a structure having a predetermined pattern. Specifically, when the surface of the second flexible substrate 304 in contact with the buffer layer 102 is treated, a photoresist material is used to protect a non-bending area of the second flexible substrate 304, wherein the surface of the second flexible substrate 304 in contact with the buffer layer 102 is treated in a specific direction, so that the rough structure 103 configured with the predetermined pattern is obtained finally.

Alternatively, the rough structure 103 may include a plurality of groves. Specifically, when the surface of the second flexible substrate 304 in contact with the buffer layer 102 is treated, a photoresist material is used to protect a non-bending area of the second flexible substrate 304, and finally the rough structure 103 is configured with the plurality of the grooves.

The third embodiment of the present invention may be implemented by another manner. Specifically, the display panel includes a first flexible substrate 101 and a second flexible substrate 304. The second flexible substrate 304 is disposed on a surface of the buffer layer 102 away from the first flexible substrate 101. In the bending area 1011 and the non-bending area 2012, each of surfaces of the first flexible substrate 101 and the second flexible substrate 304 in contact with the buffer layer 102 is provided with the rough structure 103.

In the third embodiment of the present invention, the display panel of has a two-layered flexible substrate structure, and the rough structure is also formed on the surface of the second flexible substrate in the bending area, or the rough structure is formed on the entire surface of the second flexible substrate. By using roughness of the second flexible substrate, a surface bonding force between the second flexible substrate and the buffer layer can be increased, and a carboxylic acid group, referring to FIG. 5, is contained in the rough structure, wherein a chemical bond is formed between the carboxylic acid group and the silicon dioxide of the buffer layer to further increase the surface bonding force between the second flexible substrate and the buffer layer, thereby not only improving a situation in which the first flexible substrate and the buffer layer tend to peel from the buffer layer in the bending area, but also avoiding a risk that the first flexible substrate and the buffer layer tend to peel from the buffer layer in the non-bending area.

Figure 4:
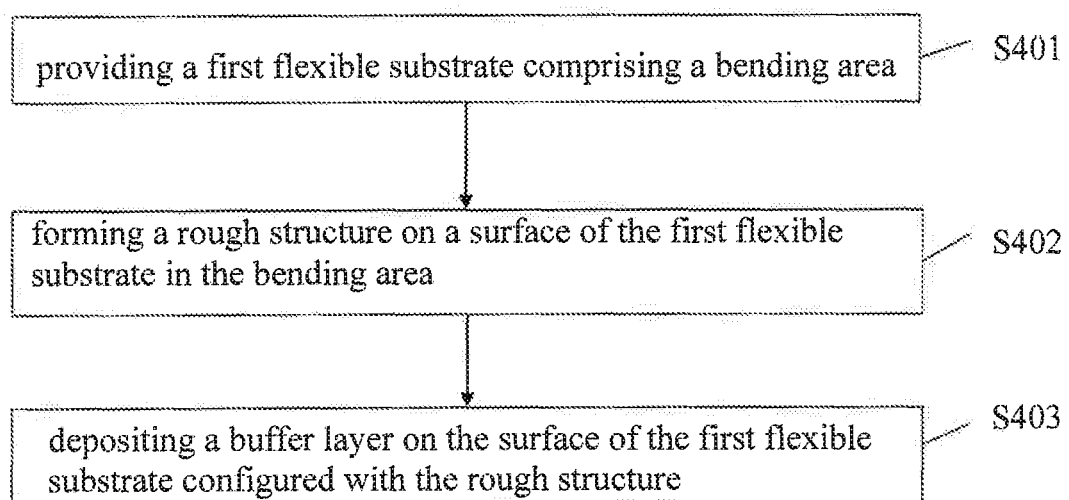
FIG. 4 is a flowchart showing a method of manufacturing a display panel in accordance with an embodiment of the present invention.

Please refer to FIG. 4. The present invention provides a method of manufacturing a display panel including the following steps:

S401: providing a first flexible substrate 101, and the first flexible substrate 101 including a bending area 1011. Specifically, a portion of the bending area 1011 may be marked on the first flexible substrate 101.

S402: forming a rough structure 103 on a surface of the first flexible substrate 101 in the bending area 1011.

Specifically, a surface of the first flexible substrate 101 may be coated with an alkali treatment solution, or the surface of the first flexible substrate 101 may be immersed in the alkali treatment solution. Then, the first flexible substrate 101 is allowed to stand for a period of time at a certain concentration and a certain temperature.

The alkaline treatment solution includes, but is not limited to, aqueous solutions containing alkaline ions, such as lithium hydroxide, sodium hydroxide, potassium hydroxide, ammonia, tetramethyl sodium hydroxide, and ethanolamine. The alkali treatment solution contains a large amount of anions including ammonium ion (NH3−) and hydroxide ion (OH−). The alkali treatment solution can react with the polyimide of the first flexible substrate 101 to slightly hydrolyze the imide bond, so that a trace amount of a carboxylic acid group is generated.

The first flexible substrate 101 can be treated under control of the concentration of the alkali treatment solution, the time of the alkali treatment, and the temperature of the alkali treatment. When the concentration of the alkali treatment solution is higher, the alkali treatment temperature is higher, the alkali treatment time is longer, and a treatment effect of the first flexible substrate 101 can be optimized. However, the concentration of the alkali treatment solution should not be too high. The concentration of the alkali treatment solution exceeding a certain value will affect performance of the first flexible substrate 101 and even cause the first flexible substrate 101 to be corroded.

In the embodiment of the present invention, the alkaline ion concentration in the alkaline treatment solution ranges from 1 to 10 mol/L. A temperature range of the first flexible substrate 101 by alkali treatment is 5-70° C. After the alkali treatment solution is applied, the standing time of the first flexible substrate 101 is 0.01-24 hours. The surface of the first flexible substrate 101 after the alkali treatment turns to a rough structure 103.

In this embodiment, when the first flexible substrate 101 is alkali-treated, a photoresist material is used to protect a portion of the first flexible substrate 101 in the non-bend area, and then alkali treatment is performed. The alkali treatment solution may be sprayed or applied in a specific direction, and finally a specific pattern with a certain regularity may be formed on the surface of the first flexible substrate 101. However, in another embodiment, the entire surface of the first flexible substrate 101 may be coated with the alkali treatment solution. After the treatment, the first flexible substrate 101 will form a plurality of grooves irregularly and uniformly distributed.

S403: depositing a buffer layer 102 on the surface of the first flexible substrate 102 configured with the rough structure 103.

Specifically, after the first flexible substrate 101 is subjected to an alkali treatment, the first flexible substrate 101 is cleaned with deionized water. Then, the buffer layer 102 is deposited on the surface of the first flexible substrate 101 subjected to alkali treatment using chemical vapor deposition (CVD).

Furthermore, the method of manufacturing the display panel of the present embodiment may further include the following steps: providing a second flexible substrate 304, wherein the second flexible substrate 304 includes a bending area 1011.

Specifically, a portion of the bending area 1011 may be marked on the second flexible substrate 304. It should be noted that the bending area 1011 of the first flexible substrate 101 and the bending area 1011 of the second flexible substrate 304 should be located at positions corresponding to each other.

The rough structure 103 is formed on a surface of the second flexible substrate 304 in the bending area 1011.

Specifically, the surface of the second flexible substrate 304 may be coated with an alkali treatment solution, or the surface of the second flexible substrate 304 may be immersed in the alkali treatment solution. Then, the second flexible substrate 304 is allowed to stand for a period of time at a certain concentration and a certain temperature.

The alkaline treatment solution includes, but is not limited to, aqueous solutions containing alkaline ions, such as lithium hydroxide, sodium hydroxide, potassium hydroxide, ammonia, tetramethyl sodium hydroxide, and ethanolamine. The alkali treatment solution contains a large amount of anions including ammonium ion ($NH_3-$) and hydroxide ion ($OH-$). The alkali treatment solution can react with the polyimide of the second flexible substrate 304 to slightly hydrolyze the imide bond, so that a trace amount of a carboxylic acid group is generated.

The second flexible substrate 304 can be treated under control of the concentration of the alkali treatment solution, the time of the alkali treatment, and the temperature of the alkali treatment. When the concentration of the alkali treatment solution is higher, the alkali treatment temperature is higher, the alkali treatment time is longer, and a treatment effect of the second flexible substrate 304 can be optimized. However, the concentration of the alkali treatment solution should not be too high. The concentration of the alkali treatment solution exceeding a certain value will affect performance of the second flexible substrate 304 and even cause the second flexible substrate 304 to be corroded.

In the embodiment of the present invention, the alkaline ion concentration in the alkaline treatment solution ranges from 1 to 10 mol/L. A temperature range of the second flexible substrate 304 by alkali treatment is 5-70° C. After the alkali treatment solution is applied, the standing time of the second flexible substrate 304 is 0.01-24 hours. The surface of the second flexible substrate 304 after the alkali treatment turns to a rough structure 103.

In this embodiment, when the second flexible substrate 304 is alkali-treated, a photoresist material is used to protect a portion of the second flexible substrate 304 in the non-bend area, and then alkali treatment is performed. The alkali treatment solution may be sprayed or applied in a specific direction, and finally a specific pattern with a certain regularity may be formed on the surface of the second flexible substrate 304. However, in another embodiment, the entire surface of the second flexible substrate 304 may be coated with the alkali treatment solution. After the treatment, the second flexible substrate 304 will form a plurality of grooves irregularly and uniformly distributed.

The second flexible substrate 304 is disposed on a surface of the buffer layer 102 away from the first flexible substrate 101

The surface of the second flexible substrate 304 provided with the rough structure 103 is in contact with the buffer layer 102.

The method of manufacturing the display panel in accordance with this embodiment is simple and its manufacturing process is easily controlled. By performing the alkali treatment on the first flexible substrate, a rough structure is formed on a surface of the first flexible substrate, and the buffer layer is silicon dioxide crystal grains. After alkali treatment of the first flexible substrate, a small amount of a carboxylic acid group is formed in the rough structure of the first flexible substrate, referring to FIG. 5, wherein a chemical bond is formed between the carboxylic acid group and the silicon dioxide to further increase the surface bonding force between the first flexible substrate and the buffer layer, thereby improving display quality.

The present invention has advantageous effects as follows: the present invention provides a display panel and a method of manufacturing the same. The display panel includes a bending area, a first flexible substrate, and a buffer layer disposed on a surface of the first flexible substrate, wherein a rough structure is disposed on a surface of the first flexible substrate in contact with the buffer layer in the bending area. The rough structure has a certain roughness capable of increasing a surface bonding force between the buffer layer and the first flexible substrate. Furthermore, the rough structure contains a carboxylic acid group, and a chemical bond is formed between the carboxylic acid group and the buffer layer, so that the surface bonding force between a flexible substrate and the buffer layer is further increased, thereby overcoming a problem that the flexible substrate is likely to peel in the bending area when bending. The display panel of the present invention may also be provided with the rough structure on a surface of the flexible substrate in contact with the buffer layer in a non-bending area to avoid a risk of peeling of the flexible substrate in the non-bending area. The method of manufacturing the display panel of the invention is simple, and a manufacturing process is easily controlled, thereby achieving a display panel having excellent display quality and high product yield.

Accordingly, although the present invention has been disclosed as a preferred embodiment, it is not intended to limit the present invention. Those skilled in the art without departing from the scope of the present invention may make various changes or modifications, and thus the scope of the present invention should be after the appended claims and their equivalents.

What is claimed is:

1. A display panel, provided with a bending area, the display panel comprising:
    a first flexible substrate;
    a buffer layer disposed on a surface of the first flexible substrate; and
    a second flexible substrate disposed on a surface of the buffer layer away from a side of the first flexible substrate;
    wherein a rough structure is disposed on a surface of the first flexible substrate in contact with the buffer layer in the bending area and is disposed on a surface of the second flexible substrate in contact with the buffer layer.

2. The display panel of claim 1, wherein the rough structure has a plurality of grooves.

3. A display panel, provided with a bending area, the display panel comprising:
    a first flexible substrate; and a buffer layer disposed on a surface of the first flexible substrate and made of silicon dioxide;

wherein a rough structure is disposed on a surface of the first flexible substrate in contact with the buffer layer in the bending area, wherein the rough structure is made of a material comprising a carboxylic acid group, and a chemical bond is formed between the carboxylic acid group and the silicon dioxide.

4. The display panel of claim 3, wherein the rough structure has a plurality of grooves.

* * * * *